United States Patent
Peana et al.

(10) Patent No.: US 11,335,245 B2
(45) Date of Patent: May 17, 2022

(54) METHOD AND APPARATUS FOR BLUE LIGHT MANAGEMENT VIA A VARIABLE LIGHT EMITTING DIODE INPUT

(71) Applicant: DELL PRODUCTS, L.P., Round Rock, TX (US)

(72) Inventors: Stefan Peana, Austin, TX (US); Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 13 days.

(21) Appl. No.: 16/934,999

(22) Filed: Jul. 21, 2020

(65) Prior Publication Data
US 2020/0349883 A1    Nov. 5, 2020

Related U.S. Application Data

(62) Division of application No. 16/058,513, filed on Aug. 8, 2018, now Pat. No. 10,803,787.

(51) Int. Cl.
*G09G 3/32* (2016.01)
*H01L 25/075* (2006.01)
*H01L 33/48* (2010.01)
*H01L 33/58* (2010.01)

(52) U.S. Cl.
CPC .......... *G09G 3/32* (2013.01); *H01L 25/0753* (2013.01); *H01L 33/483* (2013.01); *H01L 33/58* (2013.01); *G09G 2320/0666* (2013.01); *G09G 2360/16* (2013.01)

(58) Field of Classification Search
CPC ... G09G 3/32–3291; G09G 2320/0666; G09G 2360/16; G09G 2360/144; G09G 2320/043; H01L 25/0753; H01L 33/483; H01L 33/58
See application file for complete search history.

(56) References Cited

U.S. PATENT DOCUMENTS

| 8,638,288 | B2 | 1/2014 | Taylor et al. |
| 8,847,874 | B2 | 9/2014 | Prince et al. |
| 2005/0200295 | A1* | 9/2005 | Lim ............ H05B 45/20 315/150 |
| 2010/0001386 | A1 | 1/2010 | Misumi et al. |
| 2011/0069094 | A1 | 3/2011 | Knapp |
| 2012/0256938 | A1* | 10/2012 | So ............ G09G 3/3208 345/589 |
| 2013/0002157 | A1 | 1/2013 | van de Ven et al. |

(Continued)

Primary Examiner — Temesghen Ghebretinsae
Assistant Examiner — Ivelisse Martinez Quiles
(74) Attorney, Agent, or Firm — Larson Newman, LLP

(57) ABSTRACT

A first light emitting diode has a first driving input, and emits a red color light. A second light emitting diode has a second driving input, and emits a green color light. A third light emitting diode has a third driving input, and emits a blue color light. When a first current is applied to the third driving input, the third light emitting diode produces a first amount of blue light energy. When a second current is applied to the third driving input, the third light emitting diode produces a second amount of the blue light energy. The second amount of blue light energy corresponds to a percentage of blue energy reduction as compared to the amount of first blue light energy.

20 Claims, 8 Drawing Sheets

(56) References Cited

U.S. PATENT DOCUMENTS

| | | | |
|---|---|---|---|
| 2015/0348468 A1* | 12/2015 | Chen | G09G 3/3413 |
| | | | 345/207 |
| 2016/0293139 A1* | 10/2016 | Kwon | G06F 3/0482 |
| 2018/0144714 A1* | 5/2018 | Khorasani | G09G 5/02 |
| 2020/0098300 A1* | 3/2020 | Verma | G09G 5/026 |

* cited by examiner

US 11,335,245 B2

METHOD AND APPARATUS FOR BLUE LIGHT MANAGEMENT VIA A VARIABLE LIGHT EMITTING DIODE INPUT

CROSS-REFERENCE TO RELATED APPLICATION

This application is a Divisional of U.S. patent application Ser. No. 16/058,513 entitled "Method and Apparatus for Blue Light Management via a Variable Light Emitting Diode Input" filed Oct. 8, 2018, the disclosure of which is hereby expressly incorporated by reference in its entirety.

FIELD OF THE DISCLOSURE

The present disclosure generally relates to information handling systems, and more particularly relates to an apparatus with a variable light emitting diode input for blue light management.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A light emitting diode (LED) package has first, second, and third LEDs. The first LED has a first driving input, and may emit a red color light. The second LED has a second driving input, and may emit a green color light. The third LED has a third driving input, and may emit a blue color light. When a first current is applied to the third driving input the third LED may produce a first amount of blue light energy. When a second current is applied to the third driving input the third LED may produce a second amount of the blue light energy. The second amount of blue light energy may correspond to a percentage of blue energy reduction as compared to the amount of first blue light energy.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
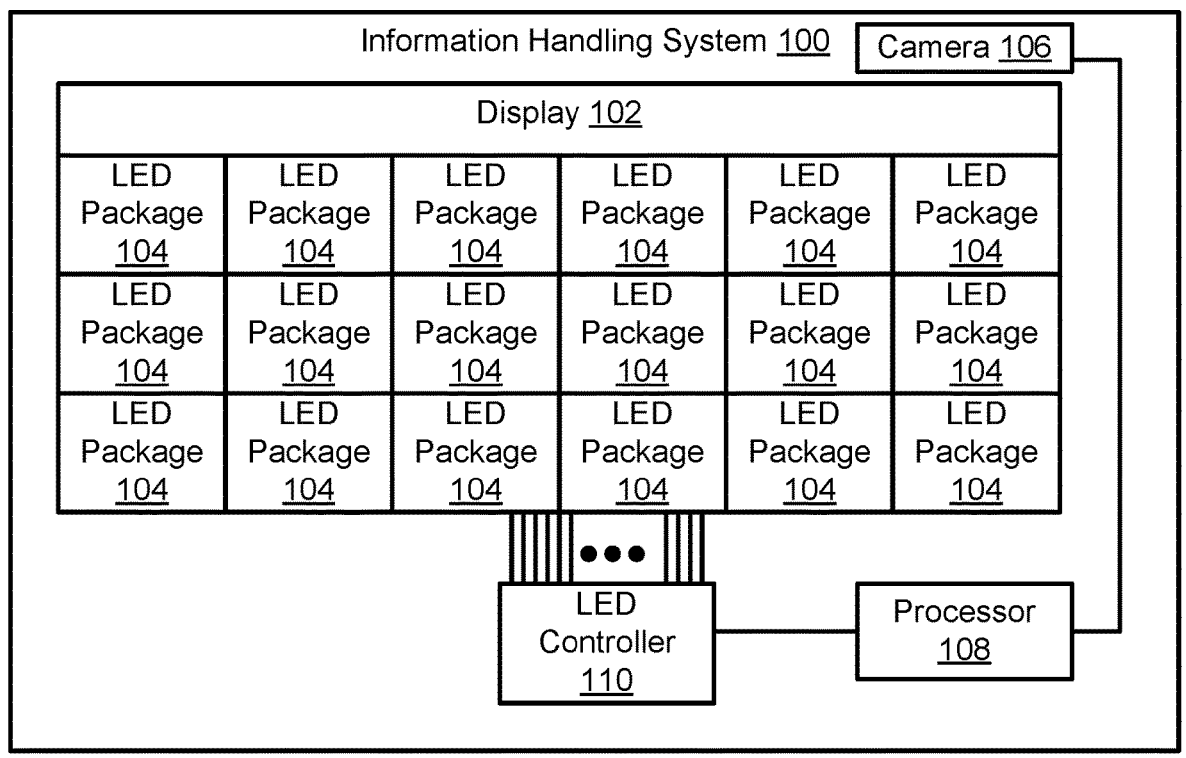
FIG. 1 is a diagram of an information handling system according to at least one embodiment of the disclosure.

FIG. 1 is a diagram of an information handling system 100 according to at least one embodiment of the disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch, a router, or another network communication device, or any other suitable device and may vary in size, shape, performance, functionality, and price.

The information handling system 100 includes a display 102, which in turn includes multiple light emitting diode (LED) packages 104, a camera 106, a processor 108, and an LED controller 110. The processor 108 can communicate with the camera 106 and with the LED controller 110. The LED controller 110 can include multiple output pins, with each output pin connected to a driving input of a corresponding LED in the LED packages 104. Each LED within the LED packages 104 includes a separate driving input, such that an amount of current provided to each LED can be individually controlled.

Figure 2:
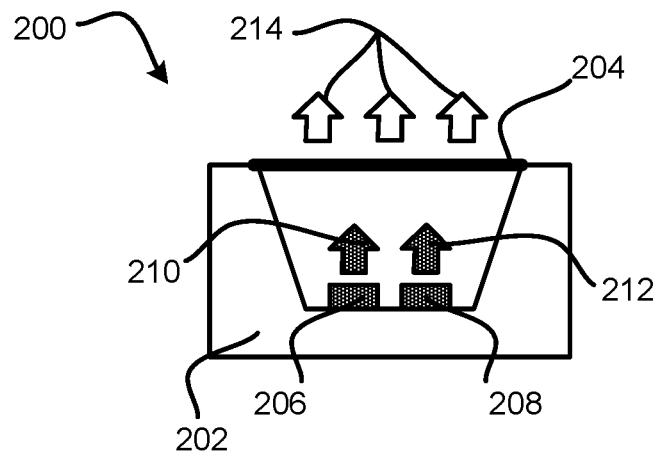
FIGS. 2-4 are diagrams of a first embodiment of an LED package for the information handling system according to at least one embodiment of the disclosure.
Figure 3:
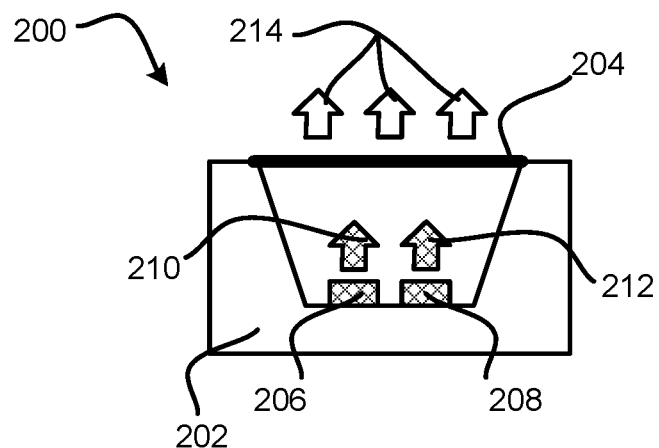
Figure 4:
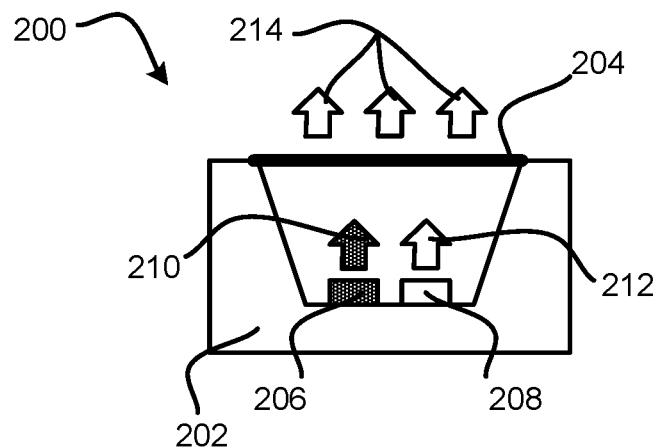
Figure 5:
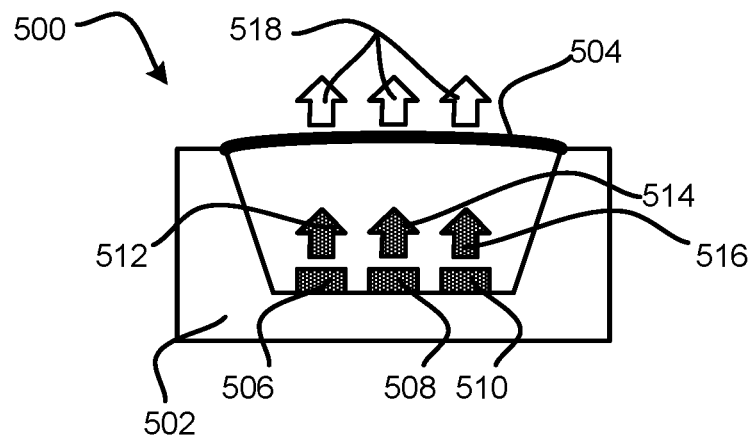
FIGS. 5 and 6 are diagrams of a second embodiment of an LED package for the information handling system according to at least one embodiment of the disclosure.
Figure 6:
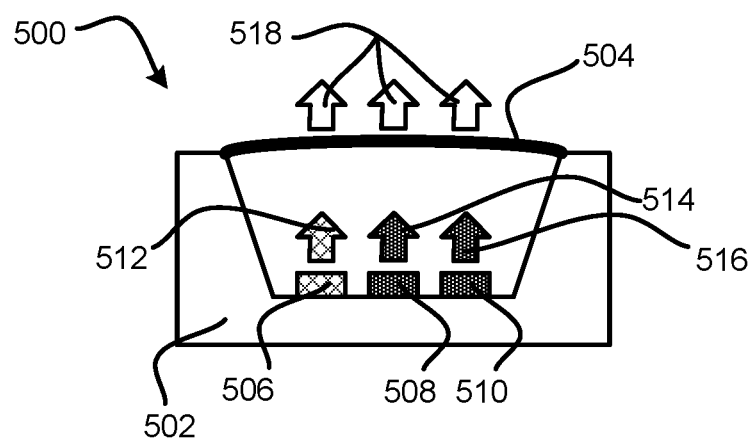
Figure 7:
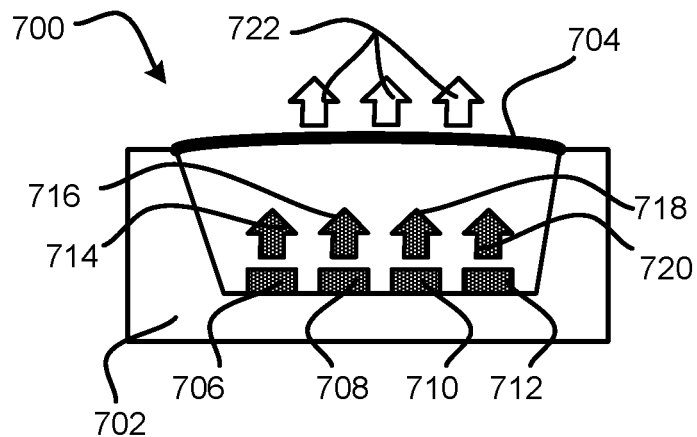
FIGS. 7-9 are diagrams of a second embodiment of an LED package for the information handling system according to at least one embodiment of the disclosure.
Figure 8:
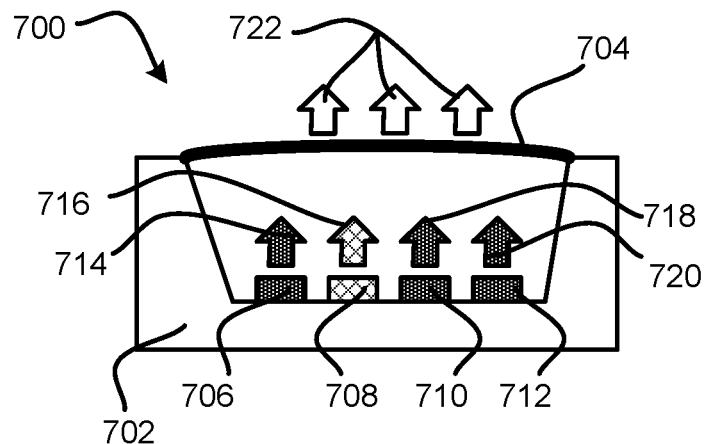
Figure 9:
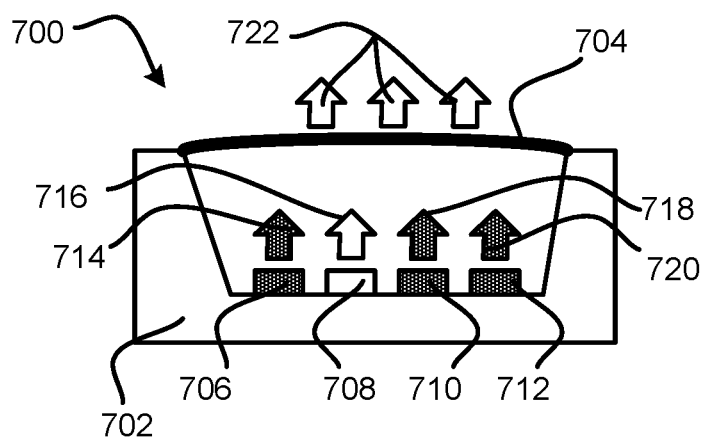

In different embodiments, the LED packages 104 can include different numbers and colors of LEDs within the package. For example, in one embodiment the LED packages 104 can include two blue LEDs with a yellow phosphor lens over the LED package 104 as shown in FIGS. 2-4. In another embodiment, the LED packages 104 can include four blue LEDs with a yellow phosphor lens. In yet another embodiment, the LED packages 104 can include a blue LED, a red LED, a green LED, and a diffusor over the blue, red, and green LEDs as shown in FIGS. 5 and 6. In another embodiment, the LED packages 104 can include two blue LEDs, a red LED, a green LED, and a diffusor over the blue, red, and green LEDs as shown in FIGS. 7-9.

In previous information handling systems, software executed by a processor could enable a user to manually or automatically adjust a white point for the display to reduce an amount of blue light energy. While this reduction in the white point would reduce the blue light energy, the white point adjust would be visually impactful to the user. The visual impact is based on the white point being a combination of red, green, and blue LEDs within the LED package, and the reduction of the blue LED would also cause a reduction in the red and green LEDs. This reduction in all color points would lead to image desaturation that is visually seen as front of screen (FOS) degradation. Thus, an improved apparatus and method for reducing blue light energy while not causing FOS degradation is disclosed herein.

During startup of the information handling system 100, the processor 108 can set the blue light energy from the LED packages 104 to a pre-determined amount. In an embodiment, this pre-determined amount can be some amount below the blue light energy from a highest level of white light. Thus in this embodiment, the processor 108 can cause the LED controller 110 to set a brightness of the display 102 to some level below a maximum level for the display. The processor 108 can also set different white light levels for the LED packages 104, such as daylight level (D65), fluorescent light level (D50), a white light level (D40), or the like. In an embodiment, the decreasing of the white light level from one level to the next can be produced by removing blue light from the LED packages 104. During a display manufacturing process each LED of the LED packages 104 can be tuned such that different level of current applied to a blue LED within the LED packages 104 can represent an output corresponding to a percentage of blue energy reduction.

The processor 108 can monitor different contextual control variables that can be utilized in determining whether to reduce the blue light energy. The contextual control variables can include the amount of blue light in the ambient light, the length of time a user is exposed to blue light, the age of the user, the amount of blue light in the visual output, whether visual output can be read without blue, the program being used, user based settings, or the like. In an embodiment, the processor 108 can access the camera 106 or other light sensor on the information handling system 100 to determine an amount of blue light in the ambient light. If the processor 108 determines that the amount of blue light ambient light is above a threshold amount, the processor 108 can cause the LED controller 110 to decrease the blue light energy from the LED packages 104. In an embodiment, the LED controller 110 can reduce the blue light energy by changing the amount of current provided to the driving input for each blue LED in the LED packages 104. In an embodiment, the adjustment of the white point of the display 102 based on environmental conditions can ensure that the user's visual adaptation to the brightness of the screen is not noticeable.

The processor 108 can also set a timer to measure a length of time that the user is exposed to blue light energy from the display 102. In an embodiment, when a visual output on the display 102 includes blue color, the processor 108 can start a count of the length of time the user is exposed to the blue light energy. If the count exceeds a threshold count, the processor 108 can cause the LED controller 110 to decrease the blue light energy from the LED packages 104. In an embodiment, if the exposure count exceeds the threshold, the processor 108 can also provide an indication to the user on the display 102. In an embodiment, the threshold count can vary based on an age of the user. For example, the threshold may increase with age. In an embodiment, the processor 108 may utilize the camera 106 and facial recognition software to determine the age of the user.

The processor 108 can determine an amount of blue light in the visual output, and can cause the LED controller 110 to decrease the blue light energy from the LED packages 104 if the amount of blue in the visual output is above a threshold amount. A determination can also be made whether the visual output can be read without blue, and if so the processor 108 can change the context for the visual output. For example, if a background of a page is blue, but the page can be read substantially the same with the background being a different color, such as green, black, or white, then the processor 108 may cause the LED controller 110 to decrease the blue light energy from the LED packages 104. The amount of blue light energy can also be adjusted based on the program running on the information handling system 100. For example, if a program being executed is a word processing application, the processor 108 can cause the LED controller 110 to decrease the blue light energy from the LED packages 104.

In an embodiment, the reduction of the blue light energy can be controlled by the processor 108 so that the reduction in the white light is smaller than an amount visible to the human eye. The reduction of the blue light energy can be in a narrow frequency band, such as in the range of about 410-470 nanometers. Thus, the independent driving inputs for the LEDs can allow the blue LEDs to be driven with less current while the driving current for the red and green LEDs remains the same. This difference in driving current control for the LED packages can offer maximum illumination efficiency without a need for intermediate losses such as using films, software control, or the like can occur.

FIGS. 2-4 show an LED package 200 for the information handling system according to at least one embodiment of the disclosure. The LED package 200 includes an enclosure 202, a phosphor coating 204, and blue LEDs 206 and 208. In an embodiment, the LED package 200 can include four blue LEDs without varying from the scope of this disclosure. In an embodiment, the LEDs 206 and 208 can receive a current from the LED controller 110 of FIG. 1, to provide a predetermined initial white level as indicated by the arrows 214. In an embodiment, the predetermined initial white level can be daylight level D65. While the LED package 200 is providing the predetermined initial white level, the LEDs 206 and 208 can produce a predetermined amount of blue light as shown by the shading of arrows 210 and 212. In an embodiment the phosphor coating 204 can be yellow, such that the combination of the blue light from the LEDs 206 and 208 and the yellow phosphor can produce white light.

If as described above the processor 108 of FIG. 1 determines that the blue light energy should be reduced, then the LED controller 110 can reduce the current provided to both of the LEDs 206 and 208. In this situation, the LEDs 206 and 208 will not be as bright and the blue light 210 and 212 produced by the LEDs 206 and 208 will be reduced as shown by the different shading in FIG. 3 as compared to FIG. 2. This reduction in current and blue light provided by the LEDs 206 and 208 can reduce the blue light energy by a particular percentage. In an embodiment, the reduced blue light can decrease the white light 214 from the initial white level to another predetermined level, such as fluorescent light D50. The amount of blue light produced by the LED package 200 can be reduced further by maintaining the current to LED 206 at the initial level, and shutting off the LED 208. In this situation, the LED 206 can produce a high amount of blue light 210 and the LED 208 will not produce any blue light 212 as indicated by the shading in FIG. 4. In an embodiment, this reduction of blue light can decrease the white light 214 to another predetermined level, such as soft white light D40. In an embodiment, if the LED package 220 includes four LEDs, the LEDs can be arranged in a square. In this embodiment, the blue light energy of the LED package 200 can be reduced by shutting off a diagonal pair of the LEDs within the LED package 200.

FIGS. 5 and 6 show an LED package 500 for the information handling system according to at least one embodiment of the disclosure. The LED package 500 includes an enclosure 502, a diffusor 504, a blue LED 506, a red LED 508, and a green LED 510. In an embodiment each of the LEDs 506, 508, and 510 can receive a different amount of current from the LED controller 110 via separate driving inputs. The LEDs 506, 508, and 510 can produce respective brightness levels 512, 514, and 516, which can be mixed together by the diffusor 504 to provide a predetermined initial white level as indicated by the arrows 518. In an embodiment, the initial white level can be daylight level D65. In an embodiment, the diffusor can create a hermetic enclosure for the LED package 500 that produces the white light from a combination of the LEDs 506, 508, and 510. While the LED package 500 is providing the initial white level, the LED 506 can produce a predetermined amount of blue light as shown by the shading of arrow 512, the LED 508 can emit red light 514, and the LED 510 can produce green light 516.

If as described above the processor 108 determines that the blue light energy should be reduced, then the LED controller 110 can reduce the current provided to the LED 506. In this situation, the LED 506 will not be as bright as the LEDs 508 and 510 as shown by the different shading in FIG. 6 as compared to FIG. 5. In an embodiment, the reduction in blue light can decrease the white light from the initial white level to another predetermined level, such as fluorescent light D50. This reduction in current and blue light provided by the LED 506 can reduce the blue light energy by a particular percentage.

FIGS. 7-9 show an LED package 700 for the information handling system according to at least one embodiment of the disclosure. The LED package 700 includes an enclosure 702, a diffusor 704, blue LEDs 706 and 708, a red LED 710, and a green LED 712. In an embodiment each of the LEDs 706, 708, 710, and 712 can receive a different amount of current from the LED controller 110 via separate driving inputs. The LEDs 706, 708, 710, and 712 can produce respective light 714, 716, 718, and 720, which can be mixed together by the diffusor 704 to provide a predetermined initial white level as indicated by the arrows 722. In an embodiment, the initial white level can be daylight level D65. While the LED package 700 is providing the initial white level, the LED 706 can produce a predetermined amount of blue light as shown by the shading of arrow 714, the LED 708 can produce a predetermined amount of blue light as shown by the shading of arrow 716, the LED 710 can red light as shown by the shading of arrow 718, and LED 712 can produce green light as shown by the shading of arrow 720.

In an embodiment, the blue light energy produced by the LED package 700 can be reduced by reducing the current provided to one of the blue LEDs, such as the LED 708. In this situation, the LED 708 will not be as bright as the LEDs 706, 710, and 712 as shown by the different shading in FIG. 8 as compared to FIG. 7. In an embodiment, the reduction in blue light can decrease the white light from the initial white level to another predetermined level, such as fluorescent light D50. This reduction in current and blue light provided by the LED 708 can reduce the blue light energy by a particular percentage. The amount of blue light produced by the LED package 700 can be reduced further by maintaining the current to LEDs 706, 710, and 712 at the initial levels, and shutting off the current to LED 708. In this situation the LEDs 706, 710, and 712 can produce a high amount of light as shown by the shading of respective arrows 714, 718, and 720, and the LED 706 will not produce any blue light as indicated by the shading of arrow 716 in FIG. 9. In an embodiment, this reduction of blue light can decrease the white light to another predetermined level, such as soft white light D40.

Figure 10:
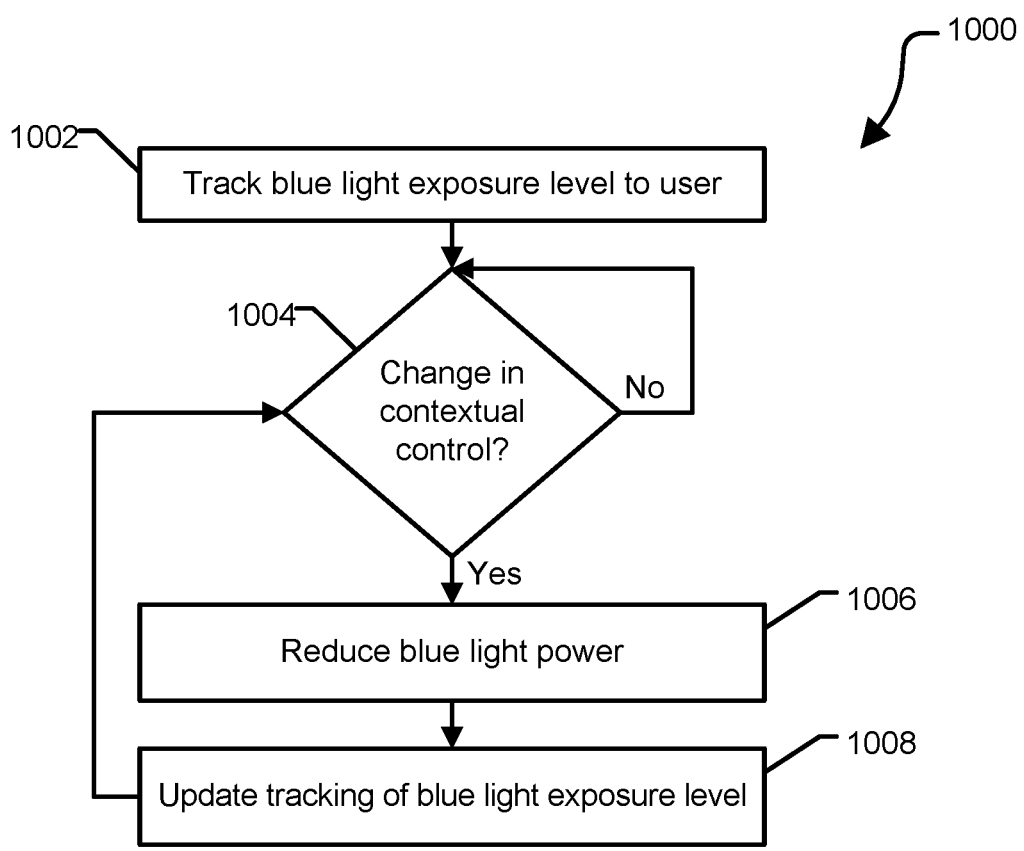
FIG. 10 is a flow diagram of a method for reducing blue light exposure from an information handling system according to at least one embodiment of the present disclosure.

FIG. 10 shows a method 1000 for reducing blue light exposure from an information handling system according to at least one embodiment of the present disclosure. At block 1002, a blue light exposure level is tracked. At block 1004, a determination is made whether a contextual control variable has changed. In an embodiment, contextual control variables can include the amount of blue light in the ambient light, the length of time user exposed to blue light, the age of the user, the amount of blue light in the visual output, whether visual output can be read without blue, program being used, user based settings, or the like. When a contextual control variable changes, blue light power is reduced at block 1006. At block 1008, the tracking of the blue light exposure is updated, and the process continues as stated above at block 1004.

Figure 11:
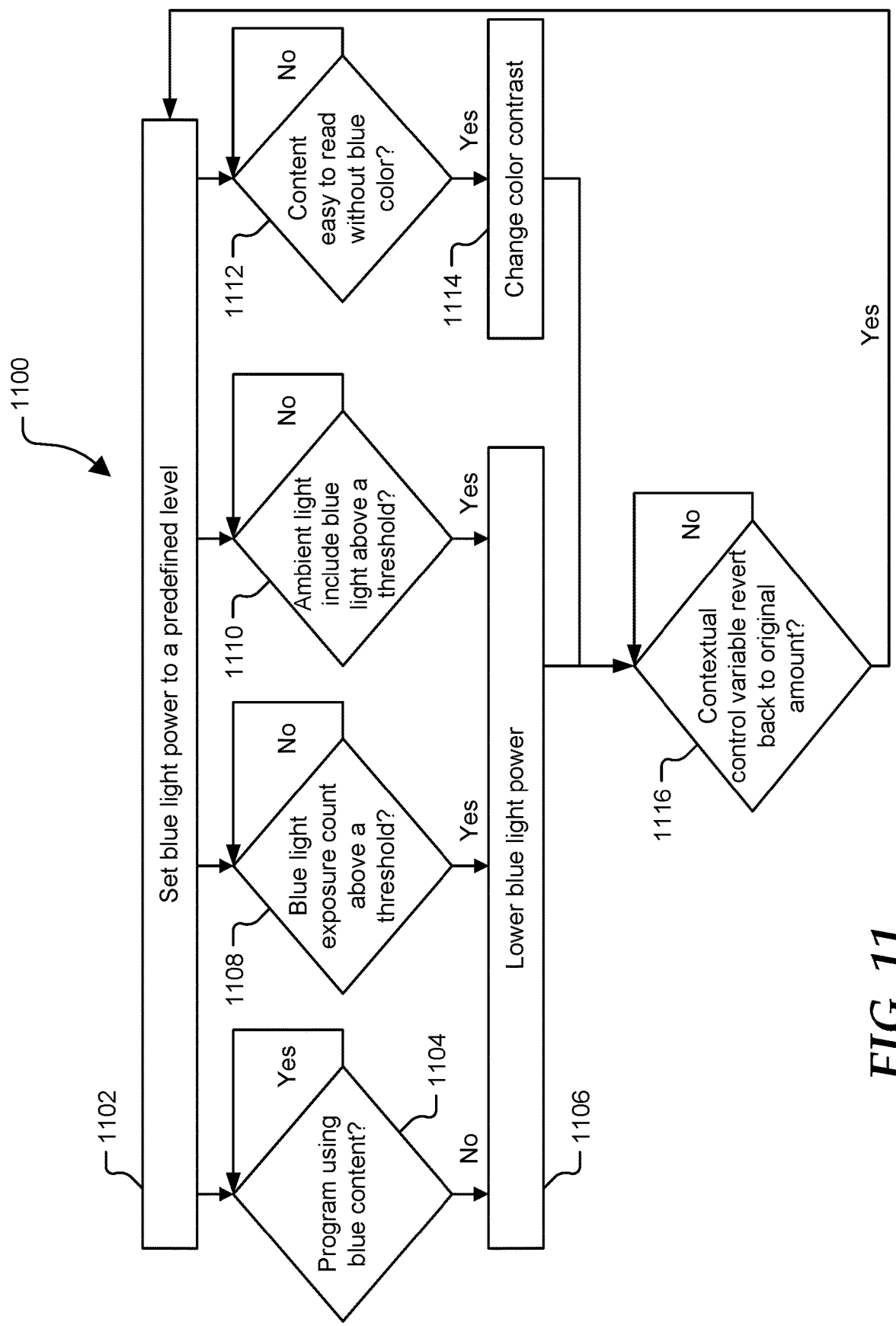
FIG. 11 is a flow diagram of another method for reducing blue light exposure from an information handling system according to at least one embodiment of the present disclosure.

FIG. 11 shows a method 1100 for reducing blue light exposure from an information handling system according to at least one embodiment of the present disclosure. At block 1102, a blue light power level is set to a predetermined level. In an embodiment, a number of different contextual control variables can affect the blue light power level. At block 1104, a determination is made whether a program is using blue content. If the program is not using blue content, then the blue light power is reduced at block 1106. At block 1108, a determination is made whether a blue light exposure count is above a threshold. When the blue light exposure count is above the threshold, the blue light power is reduced at block 1106.

At block 1110, a determination is made whether the ambient light includes blue light above a threshold. When the ambient light includes blue light above the threshold, the blue light power is reduced at block 1106. At block 1112, a determination is made whether content on a display is easy to read without blue color. When the content is easy to read without the blue color, the color contrast is changed at block 1114. At block 1116, a determination is made whether a contextual control variable has reverted back to an initial amount. When the contextual control variable reverts back to an initial amount, the flow continues as stated above at block 1102 and the blue light power is set to a predefined level.

Figure 12:
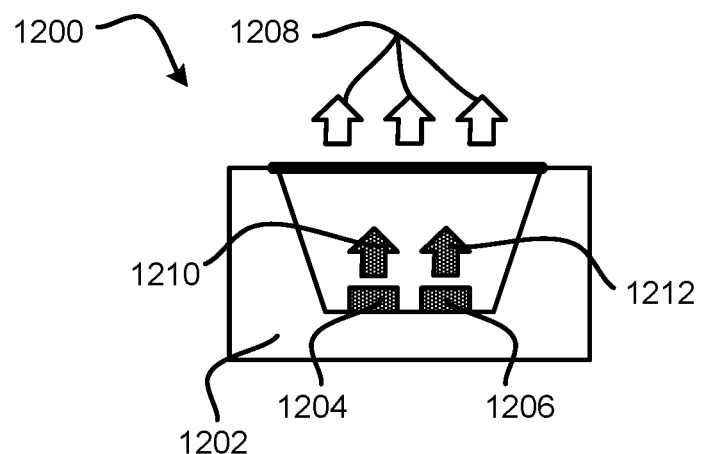
FIG. 12 is a diagram of a second embodiment of an LED package for the information handling system according to at least one embodiment of the disclosure.

FIG. 12 shows an LED package 1200 for the information handling system according to at least one embodiment of the disclosure. The LED package 1200 includes an enclosure 202 and LEDs 1204 and 1206. In an embodiment, the LED package 1200 can include more than two LEDs without varying from the scope of this disclosure. In an embodiment the LEDs 1204 and 1206 can receive a current from the LED controller 110 to provide a predetermined initial white level as indicated by the arrows 1208. In an embodiment, the predetermined initial white level can be daylight level D65. The LED controller 110 of FIG. 1 can independently drive the LEDs 1204 and 1206 with a pulse width modulated (PWM) signal to control an amount of blue light energy emitted from the LEDs 1204 and 1206. While the LED package 1200 is providing the predetermined initial white level 1208, the LEDs 1204 and 1206 can produce a predetermined amount of blue light as shown by the shading of arrows 1210 and 1212.

If as described above the processor 108 determines that the blue light energy should be reduced, the LED controller 110 of FIG. 1 can independently control the LEDs 1204 and 1206 to emit blue light energy at different wavelengths, such as 455 nanometers and 460 nanometers, to achieve a wider blue light energy spectrum. The LED controller 110 can drive these LEDs 1204 and 1206 at different peak wavelengths using different control signals to each LED. This spreading of the blue light energy provided by the LEDs 1204 and 1206 can reduce the intensity of the blue light energy. However, the red, green, and blue balance of the LED package 1200 is not disrupted, such that the white point can remain at the initial white level as indicated by the arrows 1208.

Figure 13:
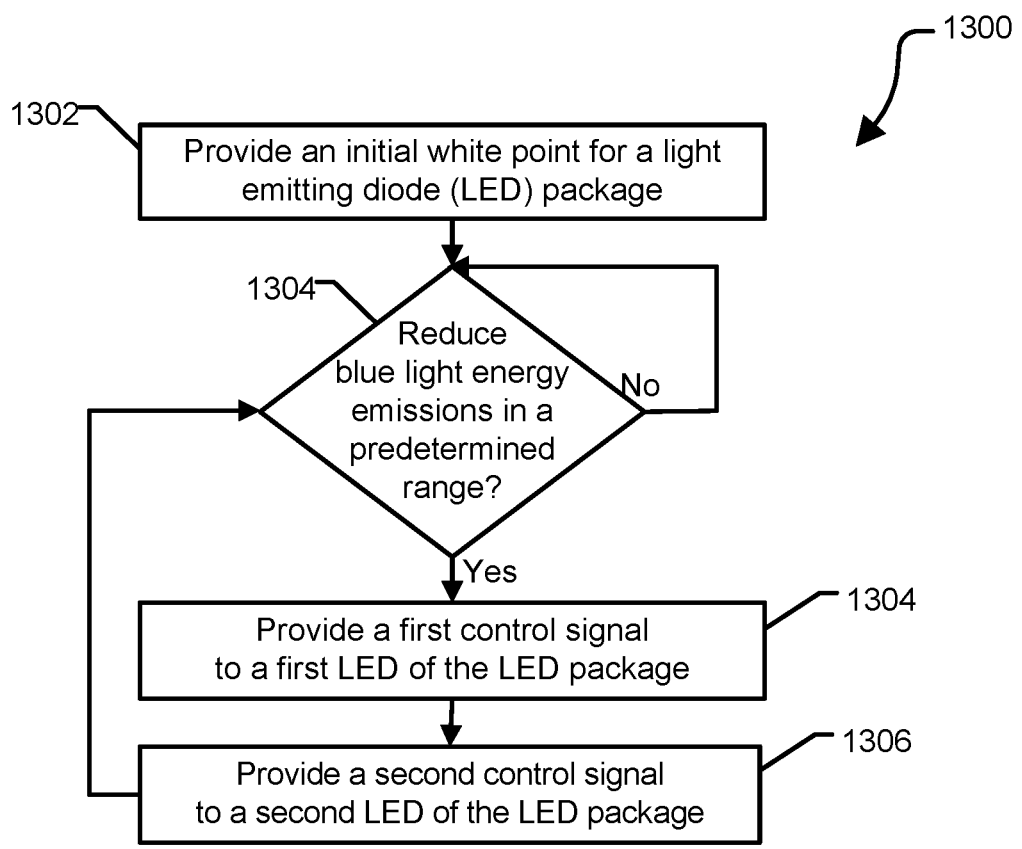
FIG. 13 is a flow diagram of a method for reducing blue light exposure intensity from an information handling system according to at least one embodiment of the present disclosure.

FIG. 13 shows a method 1300 for reducing blue light exposure intensity from an information handling system according to at least one embodiment of the present disclosure. At block 1302, an initial white point is provide from an LED package. At block 1304, a determination is made whether an amount of blue light energy within a predetermined range is to be reduced.

When blue light energy are to be reduced, a first control signal can be sent to a first LED of the LED package at block 1304. At block 1306, a second control signal can be provided to a second LED of the LED package, and the process continues as stated above at block 1304. In an embodiment, the first and second control signals can be different PWM signals that can cause the first and second LEDs to produce light with different blue light wavelengths. In an embodiment, the different wavelengths can both be outside of the predetermined range, such as 455 nanometers and 460 nanometers. In an embodiment, the different control of the first and second LEDs can result in a wider blue light energy spectrum while reducing the intensity of the blue light energy within the predetermined range.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:
1. An information handling system comprising:
a plurality of light emitting diode packages; and
a processor configured to communicate with the plurality of light emitting diode packages, the processor configured to:

set a blue light power level to a predefined level within each of the plurality of light emitting diode packages of a display within the information handling system, wherein the predefined blue light power level creates a first white light level;

detect a change in a contextual control variable for the plurality of light emitting diode packages; and reduce the blue light power level from the predefined level to a second level in response to the change in the contextual control variable, wherein the reduction of the blue light power level reduces an amount of blue light energy from the plurality of light emitting diode packages and creates a second white light level that is less than the first white light level.

2. The information handling system of claim 1, further comprising:

a light emitting diode controller configured to communicate with both the processor and the plurality of light emitting diode packages, the light emitting diode controller having a plurality of output pins, wherein each output pin is connected to a driving input of a corresponding one of the plurality of light emitting diode packages, the light emitting diode controller configured to control the plurality light emitting diode packages based on one or more signals from the processor.

3. The information handling system of claim 1, wherein each light emitting diode package of the plurality of light emitting diode packages includes a blue light emitting diode, a red light emitting diode, and a green light emitting diode.

4. The information handling system of claim 1, wherein each light emitting diode package of the plurality of light emitting diode packages includes a first blue light emitting diode, a second blue light emitting diode, a red light emitting diode, and a green light emitting diode.

5. The information handling system of claim 1, wherein the processor further configured to:

monitor a length of time that a user is exposed to a particular amount of blue light energy; and decrease the blue light energy from the plurality of light emitting diode packages in response to the length of time exceeding an exposure time threshold.

6. A method comprising:

setting a blue light power level to a predefined level within each of a plurality of light emitting diode packages of a display within an information handling system, wherein the predefined blue light power level creates a first white light level;

detecting a change in a contextual control variable for the plurality of light emitting diode packages; and reducing the blue light power level from the predefined level to a second level in response to the change in the contextual control variable, wherein the reduction of the blue light power level reduces an amount of blue light energy from the plurality of light emitting diode packages and creates a second white light level that is less than the first white light level.

7. The method of claim 6, wherein each light emitting diode package of the plurality of light emitting diode packages includes a blue light emitting diode, a red light emitting diode, and a green light emitting diode.

8. The method of claim 6, wherein each light emitting diode package of the plurality of light emitting diode packages includes a first blue light emitting diode, a second blue light emitting diode, a red light emitting diode, and a green light emitting diode.

9. The method of claim 6, further comprising:

monitoring a length of time that a user is exposed to a particular amount of blue light energy; and decreasing the blue light energy from the plurality of light emitting diode packages in response to the length of time exceeding an exposure time threshold.

10. The method of claim 9, wherein the exposure time threshold varies based on an age of the user.

11. The method of claim 6, further comprising:

monitoring an amount of ambient blue light around the display; and reducing the blue light power in response to the amount of ambient blue light exceeding an ambient blue light threshold.

12. The method of claim 6, further comprising:

determining whether visual content provided on the display includes blue colors; and reducing the blue light power in response to the visual content not including blue colors.

13. The method of claim 6, further comprising:

determining whether visual content provided on the display is viewable without blue colors; and changing a color contrast in response to the visual content being viewable without blue colors.

14. A non-transitory computer-readable medium including code that when executed by a processor performs a method, the method comprising:

setting a blue light power level to a predefined level within each of a plurality of light emitting diode packages of a display within an information handling system, wherein the predefined blue light power level creates a first white light level;

detecting a change in a contextual control variable for the plurality of light emitting diode packages; and reducing the blue light power level from the predefined level to a second level in response to the change in the contextual control variable, wherein the reduction of the blue light power level reduces an amount of blue light energy from the plurality of light emitting diode packages and creates a second white light level that is less than the first white light level.

15. The non-transitory computer-readable medium of claim 14, wherein the method further comprises:

monitoring a length of time that a user is exposed to a particular amount of blue light energy; and decreasing the blue light energy from the plurality of light emitting diode packages in response to the length of time exceeding an exposure time threshold.

16. The non-transitory computer-readable medium of claim 14, wherein each light emitting diode package of the plurality of light emitting diode packages includes a blue light emitting diode, a red light emitting diode, and a green light emitting diode.

17. The non-transitory computer-readable medium of claim 14, wherein each light emitting diode package of the plurality of light emitting diode packages includes a first blue light emitting diode, a second blue light emitting diode, a red light emitting diode, and a green light emitting diode.

18. The non-transitory computer-readable medium of claim 14, wherein the method further comprises:

monitoring an amount of ambient blue light around the display; and reducing the blue light power in response to the amount of ambient blue light exceeding an ambient blue light threshold.

19. The non-transitory computer-readable medium of claim 14, wherein the method further comprises:
- determining whether visual content provided on the display includes blue colors; and
- reducing the blue light power in response to the visual content not including blue colors.

20. The non-transitory computer-readable medium of claim 14, wherein the method further comprises:
- determining whether visual content provided on the display is viewable without blue colors; and
- changing a color contrast in response to the visual content being viewable without blue colors.

* * * * *